(12) United States Patent
Kayum et al.

(10) Patent No.: US 11,261,707 B2
(45) Date of Patent: Mar. 1, 2022

(54) METHOD AND SYSTEM FOR WELL ASSIGNMENT IN A RESERVOIR SIMULATION BASED ON WELL ACTIVITY

(71) Applicant: SAUDI ARABIAN OIL COMPANY, Dhahran (SA)

(72) Inventors: Suha Naim Kayum, Dhahran (SA); Marcin Rogowski, Dhahran (SA); Michel Cancelliere, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 146 days.

(21) Appl. No.: 16/832,179

(22) Filed: Mar. 27, 2020

(65) Prior Publication Data

US 2021/0301626 A1    Sep. 30, 2021

(51) Int. Cl.
*E21B 41/00* (2006.01)
*G06F 30/20* (2020.01)

(52) U.S. Cl.
CPC .............. *E21B 41/00* (2013.01); *G06F 30/20* (2020.01); *E21B 2200/20* (2020.05)

(58) Field of Classification Search
CPC ....... E21B 41/00; E21B 2200/20; G06F 30/20
See application file for complete search history.

(56) References Cited

U.S. PATENT DOCUMENTS

| | | | |
|---|---|---|---|
| 9,187,984 B2 | 11/2015 | Usadi et al. | |
| 9,703,006 B2 | 7/2017 | Stern et al. | |
| 10,282,496 B2 | 5/2019 | Walsh et al. | |
| 2007/0265815 A1 | 11/2007 | Couet et al. | |
| 2009/0299714 A1 | 12/2009 | Kelkar et al. | |
| 2010/0005173 A1* | 1/2010 | Baskaran | G06F 9/5066 709/226 |
| 2010/0217574 A1* | 8/2010 | Usadi | E21B 43/00 703/10 |
| 2014/0236558 A1 | 8/2014 | Maliassov | |

(Continued)

FOREIGN PATENT DOCUMENTS

EP    2096469 A1    9/2009

OTHER PUBLICATIONS

Gratien, J.M. et al., "Scalability and Load-Balancing Problems in Parallel Reservoir Simulation", SPE 106023, SPE International, 2007 (6 pages).

(Continued)

*Primary Examiner* — Chuen-Meei Gan
(74) *Attorney, Agent, or Firm* — Osha Bergman Watanabe & Burton LLP

(57) ABSTRACT

A method may include obtaining well activity data regarding various wells in a reservoir region of interest. The method may further include determining a predetermined well assignment for various parallel processing stages using a bin-packing problem algorithm and the well activity data. The predetermined well assignment may assign the wells to the parallel processing stages. A respective parallel processing stage among the parallel processing stages may perform a portion of a reservoir simulation using a respective computer processor and a well among the wells. The method may further include simulating the reservoir region of interest based on the wells being simulated according the predetermined well assignment for the parallel processing stages.

20 Claims, 13 Drawing Sheets

(56) References Cited

U.S. PATENT DOCUMENTS

| | | |
|---|---|---|
| 2015/0338550 A1 | 11/2015 | Wadsley |
| 2016/0222766 A1 | 8/2016 | Rowan et al. |
| 2017/0140079 A1* | 5/2017 | Gentilhomme ......... G06F 17/18 |
| 2017/0344676 A1 | 11/2017 | Antonini et al. |
| 2018/0137223 A1 | 5/2018 | Fung et al. |
| 2018/0371875 A1* | 12/2018 | Kayum ................... G06F 30/20 |

OTHER PUBLICATIONS

Dogru, Ali H., "New Frontiers in Large Scale Reservoir Simulation", SPE 142297, SPE International, 2011 (12 pages).
International Search Report and Written Opinion issued in corresponding International Patent Application No. PCT/US2020/028617, dated Jan. 15, 2021 (14 pages).
Sumir Chandra et al.; "Addressing spatiotemporal and computational heterogeneity in structured adaptive mesh refinement"; Computing and Visualization in Science, Springer; vol. 9, No. 3; Aug. 29, 2006; pp. 145-163 (19 pages).
Kayum Suha N et al.; "Optimal Resource Allocation for Parallel Reservoir Simulation"; 2019 IEEE High Performance Extreme Computing Conference (HPEC), IEEE; Sep. 24, 2019; pp. 1-4 (4 pages).
"Bin Packing", American Mathematical Society, Jan. 31, 2020, URL: <https://web.archive.org/web/202001 31002056/http://www.ams.org/publicoutreach/feature-column/fcarc-bins3> (5 pages).

\* cited by examiner

METHOD AND SYSTEM FOR WELL ASSIGNMENT IN A RESERVOIR SIMULATION BASED ON WELL ACTIVITY

BACKGROUND

Well performance models play an important role in managing hydrocarbon production at various well sites. In particular, a well performance model may calculate future oil, water and gas production rates from a well in an oil and gas reservoir. For example, production at one well in a reservoir may have an effect on future production on a different well connected to the same reservoir. Accordingly, reservoir simulations often model multiple wells on a reservoir rather than a single well. However, increasing the number of wells in a reservoir simulation may also increase the runtime necessary to perform the reservoir simulation.

SUMMARY

In general, in one aspect, embodiments relate to a method that includes obtaining well activity data regarding various wells in a reservoir region of interest. The method further includes determining a predetermined well assignment for various parallel processing stages using a bin-packing problem algorithm and the well activity data. The predetermined well assignment assigns the wells to the parallel processing stages. A respective parallel processing stage among the parallel processing stages performs a portion of a reservoir simulation using a respective computer processor and a well among the wells. The method further includes simulating the reservoir region of interest based on the wells being simulated according the predetermined well assignment for the parallel processing stages.

In general, in one aspect, embodiments relate to a computer system that includes a processor and a memory coupled to the processor. The memory obtains well activity data regarding various wells in a reservoir region of interest. The memory further determines a predetermined well assignment for various parallel processing stages using a bin-packing problem algorithm and the well activity data. The predetermined well assignment assigns the wells to the parallel processing stages. A respective parallel processing stage among the parallel processing stages performs a portion of a reservoir simulation using a respective computer processor and a well among the wells. The memory further simulates the reservoir region of interest based on the wells being simulated according the predetermined well assignment for the parallel processing stages.

In general, in one aspect, embodiments relate to non-transitory computer readable medium storing instructions executable by a computer processor. The instructions obtain well activity data regarding various wells in a reservoir region of interest. The instructions further determine a predetermined well assignment for various parallel processing stages using a bin-packing problem algorithm and the well activity data. The predetermined well assignment assigns the wells to the parallel processing stages. A respective parallel processing stage among the parallel processing stages performs a portion of a reservoir simulation using a respective computer processor and a well among the wells. The instructions further simulate the reservoir region of interest based on the wells being simulated according the predetermined well assignment for the parallel processing stages.

Other aspects of the disclosure will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Figure 1:
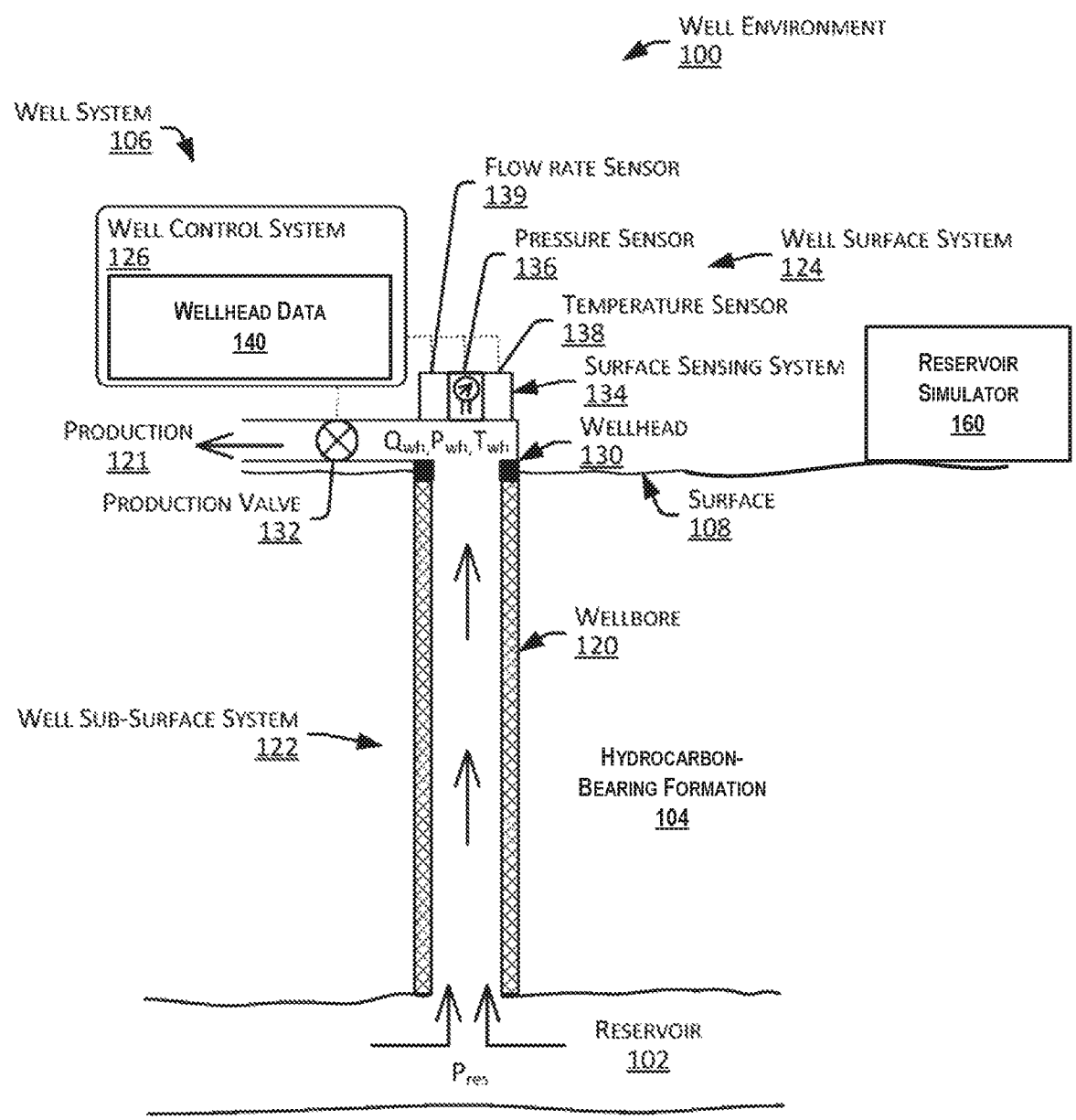
FIGS. 1, 2A, 2B, and 3 show systems in accordance with one or more embodiments.

Specific embodiments of the disclosure will now be described in detail with reference to the accompanying figures. Like elements in the various figures are denoted by like reference numerals for consistency.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the disclosure include systems and methods for using bin-packing problem algorithms to manage well allocation in multiple parallel processing stages of a reservoir simulation. For example, wells of a reservoir simulation may be described in a well list, where the wells may include both historical wells and wells in a prediction phase. For a well in a prediction phase, a reservoir simulator may not know the duration of well activity for the predicted phase before running the simulation, which may make it difficult to optimally manage prediction phases using parallel processing. Accordingly, in some embodiments, a reservoir simulator performs a coarsened simulation prior to performing the primary fine-grid simulation of a reservoir. Using the coarsened simulation results, well activity for the prediction phase may be estimated in order to manage parallel processing of the reservoir simulation.

Using the well activity for historical wells and wells in prediction phases, a bin-packing problem algorithm may assist in parallel processing management. For example, a bin-packing problem may be a problem in which a number of items (e.g., wells in a reservoir simulation) of different volumes are packed into a finite number of bins or containers. To optimize a solution to the bin-packing problem, an algorithm may seek to minimize the total number of bins that are used. Examples of bin-packing problem algorithms may include a First-fit (FF) algorithm, a Next-fit (NF) algorithm, a First-fit Decreasing (FFD) algorithm, a First-fit Increasing (FFI) algorithm, or a Best-fit (BF) algorithm.

Applying the concepts of a bin-packing problem to reservoir simulations, a reservoir simulation may partition a static grid of a geological region, and assign wells to different computer processes running simultaneously during the reservoir simulation. As such, the wells in the reservoir simulation may be dynamically assigned through the assistance of a combinatorial algorithm, such as a bin-packing problem algorithm. Thus, some embodiments may result in reducing computational imbalance during a simulation by making the situation less frequent where one computer process solves multiple wells while a different computer process is inactive. Accordingly, distributing wells more evenly across computer processors by incorporating a well's respective activity over time into the well assignment may decrease computational runtime while obtaining similar results.

Turning to FIG. 1, FIG. 1 shows a schematic diagram in accordance with one or more embodiments. As shown in FIG. 1, FIG. 1 illustrates a well environment (100) that includes a hydrocarbon reservoir ("reservoir") (102) located in a subsurface hydrocarbon-bearing formation ("formation") (104) and a well system (106). The hydrocarbon-bearing formation (104) may include a porous or fractured rock formation that resides underground, beneath the earth's surface ("surface") (108). In the case of the well system (106) being a hydrocarbon well, the reservoir (102) may include a portion of the hydrocarbon-bearing formation (104). The hydrocarbon-bearing formation (104) and the reservoir (102) may include different layers of rock having varying characteristics, such as varying degrees of permeability, porosity, and resistivity. In the case of the well system (106) being operated as a production well, the well system (106) may facilitate the extraction of hydrocarbons (or "production") from the reservoir (102).

In some embodiments, the well system (106) includes a wellbore (120), a well sub-surface system (122), a well surface system (124), and a well control system ("control system") (126). The control system (126) may control various operations of the well system (106), such as well production operations, well completion operations, well maintenance operations, and reservoir monitoring, assessment and development operations. In some embodiments, the control system (126) includes a computer system that is the same as or similar to that of computer system (800) described below in FIGS. 8A and 8B and the accompanying description.

The wellbore (120) may include a bored hole that extends from the surface (108) into a target zone of the hydrocarbon-bearing formation (104), such as the reservoir (102). An upper end of the wellbore (120), terminating at or near the surface (108), may be referred to as the "up-hole" end of the wellbore (120), and a lower end of the wellbore, terminating in the hydrocarbon-bearing formation (104), may be referred to as the "down-hole" end of the wellbore (120). The wellbore (120) may facilitate the circulation of drilling fluids during drilling operations, the flow of hydrocarbon production ("production") (121) (e.g., oil and gas) from the reservoir (102) to the surface (108) during production operations, the injection of substances (e.g., water) into the hydrocarbon-bearing formation (104) or the reservoir (102) during injection operations, or the communication of monitoring devices (e.g., logging tools) into the hydrocarbon-bearing formation (104) or the reservoir (102) during monitoring operations (e.g., during in situ logging operations).

In some embodiments, during operation of the well system (106), the control system (126) collects and records wellhead data (140) for the well system (106). The wellhead data (140) may include, for example, a record of measurements of wellhead pressure ($P_{wh}$) (e.g., including flowing wellhead pressure), wellhead temperature ($T_{wh}$) (e.g., including flowing wellhead temperature), wellhead production rate ($Q_{wh}$) over some or all of the life of the well (106), and water cut data. In some embodiments, the measurements are recorded in real-time, and are available for review or use within seconds, minutes or hours of the condition being sensed (e.g., the measurements are available within 1 hour of the condition being sensed). In such an embodiment, the wellhead data (140) may be referred to as "real-time" wellhead data (140). Real-time wellhead data (140) may enable an operator of the well (106) to assess a relatively current state of the well system (106), and make real-time decisions regarding development of the well system (106) and the reservoir (102), such as on-demand adjustments in regulation of production flow from the well.

In some embodiments, the well sub-surface system (122) includes casing installed in the wellbore (120). For example, the wellbore (120) may have a cased portion and an uncased (or "open-hole") portion. The cased portion may include a portion of the wellbore having casing (e.g., casing pipe and casing cement) disposed therein. The uncased portion may include a portion of the wellbore not having casing disposed therein. In some embodiments, the casing includes an annular casing that lines the wall of the wellbore (120) to define a central passage that provides a conduit for the transport of tools and substances through the wellbore (120). For example, the central passage may provide a conduit for lowering logging tools into the wellbore (120), a conduit for the flow of production (121) (e.g., oil and gas) from the reservoir (102) to the surface (108), or a conduit for the flow of injection substances (e.g., water) from the surface (108) into the hydrocarbon-bearing formation (104). In some embodiments, the well sub-surface system (122) includes production tubing installed in the wellbore (120). The production tubing may provide a conduit for the transport of tools and substances through the wellbore (120). The production tubing may, for example, be disposed inside casing. In such an embodiment, the production tubing may provide a conduit for some or all of the production (121) (e.g., oil and gas) passing through the wellbore (120) and the casing.

In some embodiments, the well surface system (124) includes a wellhead (130). The wellhead (130) may include a rigid structure installed at the "up-hole" end of the wellbore (120), at or near where the wellbore (120) terminates at the Earth's surface (108). The wellhead (130) may include structures for supporting (or "hanging") casing and production tubing extending into the wellbore (120). Production (121) may flow through the wellhead (130), after exiting the wellbore (120) and the well sub-surface system (122), including, for example, the casing and the production tubing. In some embodiments, the well surface system (124) includes flow regulating devices that are operable to control the flow of substances into and out of the wellbore (120). For example, the well surface system (124) may include one or more production valves (132) that are operable to control the flow of production (134). For example, a production valve (132) may be fully opened to enable unrestricted flow of production (121) from the wellbore (120), the production valve (132) may be partially opened to partially restrict (or "throttle") the flow of production (121) from the wellbore (120), and production valve (132) may be fully closed to fully restrict (or "block") the flow of production (121) from the wellbore (120), and through the well surface system (124).

In some embodiments, the wellhead (130) includes a choke assembly. For example, the choke assembly may include hardware with functionality for opening and closing the fluid flow through pipes in the well system (106). Likewise, the choke assembly may include a pipe manifold that may lower the pressure of fluid traversing the wellhead. As such, the choke assembly may include set of high pressure valves and at least two chokes. These chokes may be fixed or adjustable or a mix of both. Redundancy may be provided so that if one choke has to be taken out of service, the flow can be directed through another choke. In some embodiments, pressure valves and chokes are communicatively coupled to the well control system (126). Accordingly, a well control system (126) may obtain wellhead data regarding the choke assembly as well as transmit one or more commands to components within the choke assembly in order to adjust one or more choke assembly parameters.

Keeping with FIG. 1, in some embodiments, the well surface system (124) includes a surface sensing system (134). The surface sensing system (134) may include sensors for sensing characteristics of substances, including production (121), passing through or otherwise located in the well surface system (124). The characteristics may include, for example, pressure, temperature and flow rate of production (121) flowing through the wellhead (130), or other conduits of the well surface system (124), after exiting the wellbore (120).

In some embodiments, the surface sensing system (134) includes a surface pressure sensor (136) operable to sense the pressure of production (151) flowing through the well surface system (124), after it exits the wellbore (120). The surface pressure sensor (136) may include, for example, a wellhead pressure sensor that senses a pressure of production (121) flowing through or otherwise located in the wellhead (130). In some embodiments, the surface sensing system (134) includes a surface temperature sensor (138) operable to sense the temperature of production (151) flowing through the well surface system (124), after it exits the wellbore (120). The surface temperature sensor (138) may include, for example, a wellhead temperature sensor that senses a temperature of production (121) flowing through or otherwise located in the wellhead (130), referred to as "wellhead temperature" ($T_{wh}$). In some embodiments, the surface sensing system (134) includes a flow rate sensor (139) operable to sense the flow rate of production (151) flowing through the well surface system (124), after it exits the wellbore (120). The flow rate sensor (139) may include hardware that senses a flow rate of production (121) ($Q_{wh}$) passing through the wellhead (130).

In some embodiments, the well system (106) includes a reservoir simulator (160). For example, the reservoir simulator (160) may include hardware and/or software with functionality for generating one or more reservoir models regarding the hydrocarbon-bearing formation (104) and/or performing one or more reservoir simulations. For example, the reservoir simulator (160) may store well logs and data regarding core samples for performing simulations. A reservoir simulator may further analyze the well log data, the core sample data, seismic data, and/or other types of data to generate and/or update the one or more reservoir models. While the reservoir simulator (160) is shown at a well site, embodiments are contemplated where reservoir simulators are located away from well sites. In some embodiments, the reservoir simulator (160) may include a computer system that is similar to the computer system (800) described below with regard to FIGS. 8A and 8B and the accompanying description.

Keeping with reservoir simulators, a reservoir simulator may include functionality for solving well equations and reservoir equations separately, e.g., using Additive Schwartz methods. When the number of wells in a simulation is relatively small, computation time spent solving well equations may be a small fraction of the total computation time. However, in massive full-field simulations, where hundreds or thousands of wells are being simulated, the total computation time for solving well equations may increase considerably. This may be particularly true when a multi-segment well model is used as the number of unknown well parameters to be solved may be much larger than a conventional well model. As such, reservoir simulators may assign wells to computer processes in parallel computing tasks statically and/or dynamically. For example, at the beginning of a reservoir simulation, a well may be assigned to a single computer process that performs the computations necessary for this well. In some embodiments, placement of a well within a computer process may be independent of grid partitioning, e.g., whether the well is surrounded by fine-grid cells or coarsened grid blocks. During a simulation, a computer process may access both grid data for a reservoir model and well data. As such, well assignment may affect such parallel communication patterns and thereby may influence reservoir simulation performance.

In some embodiments, well assignment for parallel computer processes may include the case where a number of wells being simulated is greater than the number of computer processes involved in a reservoir simulation. Thus, multiple wells may be assigned to one computer process operating within a parallel processing stage. As wells may not need to be solved at all times during a reservoir simulation, e.g., only when the wells are producing or injecting, a situation may occur where one computer process is solving equations for multiple wells while a production well assigned to another computer process is inactive causing the computer process to be idle (i.e., waiting for the other computer processes to finish in the parallel processing stage).

Figure 2A:
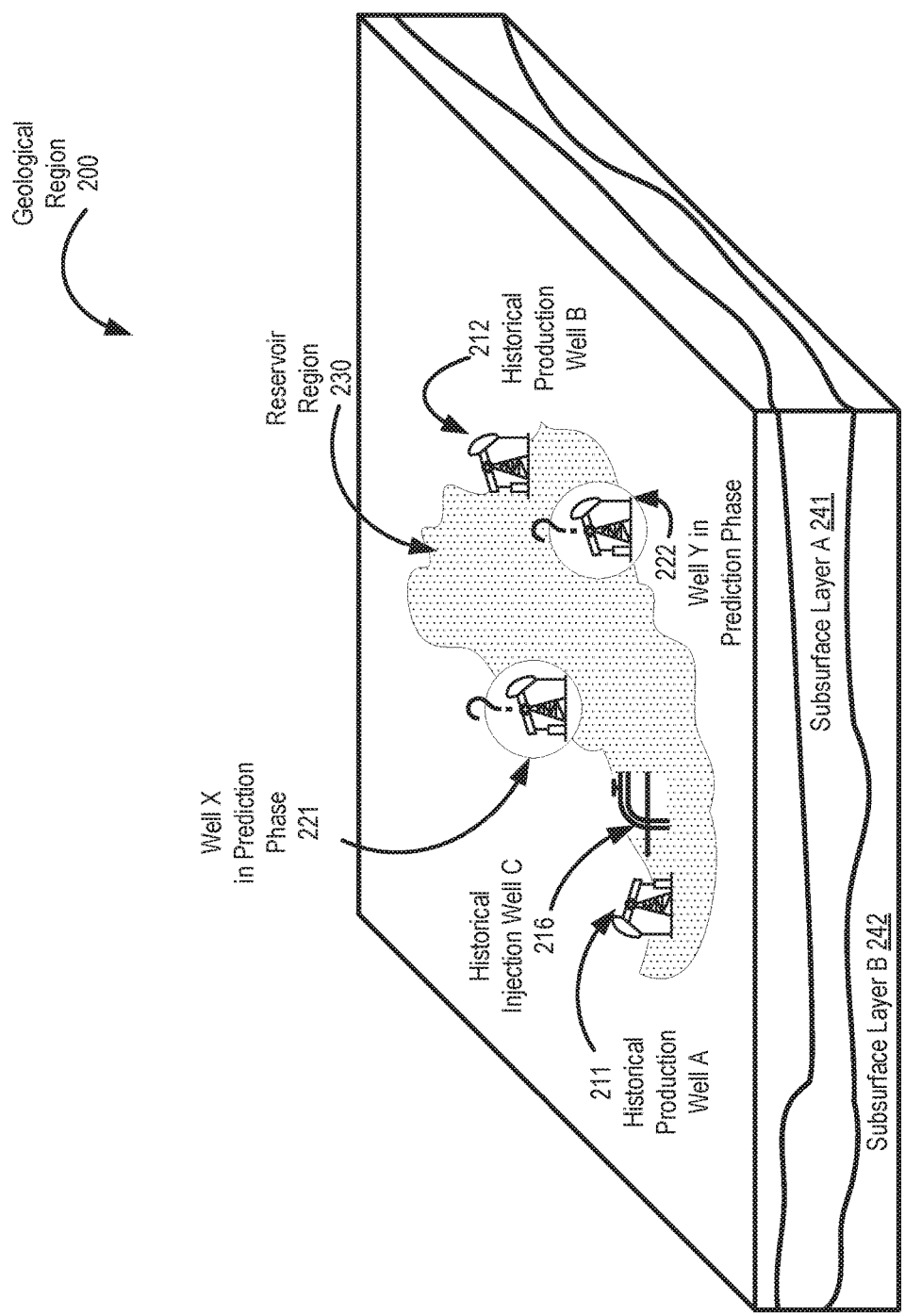

Turning to FIG. 2A, FIG. 2A shows a schematic diagram in accordance with one or more embodiments. As illustrated in FIG. 2A, FIG. 2A shows a geological region (200) that may include one or more reservoir regions (e.g., reservoir region (230)) with various production wells (e.g., historical production well A (211), historical production well (212)). For example, a production well may be similar to the well system (106) described above in FIG. 1 and the accompanying description. Likewise, a reservoir region may also include one or more injection wells (e.g., historical injection well C (216)) that include functionality for enhancing production by one or more neighboring production wells. As shown in FIG. 2A, wells may be disposed in the reservoir region (230) above various subsurface layers (e.g., subsurface layer A (241), subsurface layer B (242)), which may include hydrocarbon deposits. Likewise, production wells in prediction phases (e.g., well X in prediction phase (221), well Y in prediction phase (222)) may be contemplated for a geological region. In particular, where production data and/or injection data may exist for a historical well, a well in a prediction phase may lack corresponding data since the well is set in the future, e.g., some point in time within a reservoir simulation. Production data may include data that describes production or production operations at a well, such as wellhead data (142) described in FIG. 1 and the accompanying description.

Figure 2B:
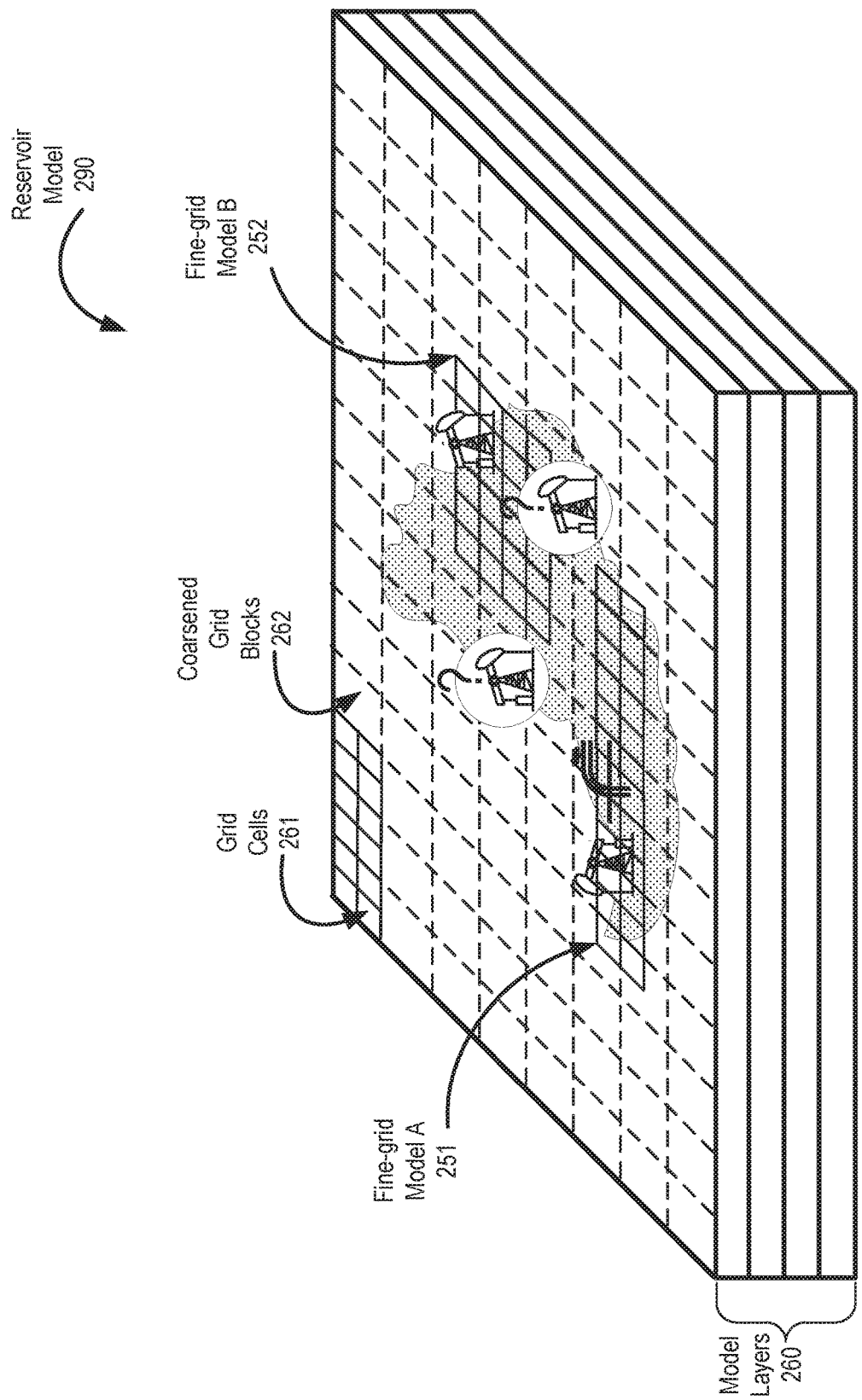

Turning to FIG. 2B, FIG. 2B shows a schematic diagram in accordance with one or more embodiments. As illustrated in FIG. 2A, FIG. 2A shows a reservoir model (290) that corresponds to the geological region (200) from FIG. 2A. More specifically, the reservoir model (290) includes grid cells (261) that may refer to an original cell of a reservoir model. Likewise, the reservoir model may also include coarsened grid blocks (262) that may refer to an amalgamation of cells. For example, a grid cell may be the case of a 1×1 block, where coarsened grid blocks may be of sizes 2×2, 4×4, 8×8 etc. Both the grid cells (261) and the coarsened grid blocks (262) may correspond to columns for multiple model layers (260) within the reservoir model (290).

Prior to performing a reservoir simulation, local grid refinement and coarsening (LGR) may be used to increase or decrease grid resolution in a certain area of reservoir model. By discretizing reservoir properties, e.g., permeability, porosity or saturations, within grid cells and coarsened grid blocks, reservoir properties within a respective cell or respective block may be approximated by introducing a discretization error. Thus, finer grids may reduce discretization errors through a higher computational cost. As shown in FIG. 2B, for example, the reservoir model (290) may include various fine-grid models (i.e., fine-grid model A (251), fine-grid model B (252)), that are surrounded by coarsened block regions.

In some embodiments, proxy models or reduced-order models may be generated for performing a reservoir simulation. For example, one way to reduce model dimensionality is to reduce the number of grid blocks and/or grid cells. By averaging reservoir properties into larger blocks while preserving the flow properties of a reservoir model, computational time of a reservoir simulation may be reduced. In general, coarsening may be applied to cells that do not contribute to a total flow within a reservoir region because a slight change on such reservoir properties may not affect the output of a simulation. Accordingly, different levels of coarsening may be used on different regions of the same reservoir model. As such, a coarsening ratio may correspond to a measure of coarsening efficiency, which may be defined as a total number of cells in a coarsened reservoir model divided by the original number of cells in the original reservoir model.

Figure 3:
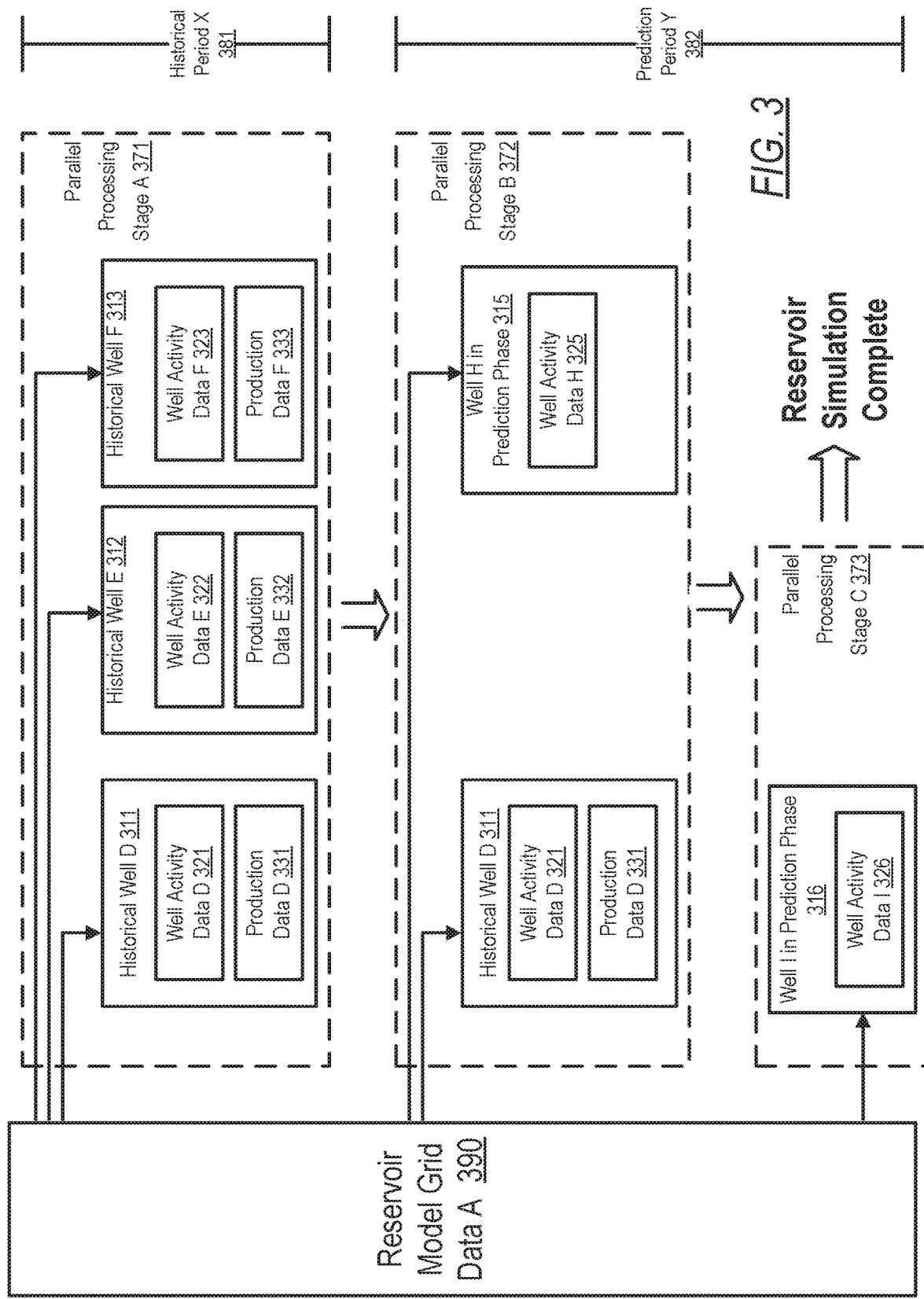

Turning to FIG. 3, FIG. 3 shows a schematic diagram in accordance with one or more embodiments. In FIG. 3, reservoir model grid data (e.g., reservoir model grid data A (390)) may be obtained by a reservoir simulator (e.g., reservoir simulator (160) described in FIG. 1) in order to perform a reservoir simulation. For example, reservoir model grid data may include reservoir properties for original grid cells and/or coarsened grid block data. Likewise, reservoir model grid data may correspond to the grid data that forms a reservoir model similar to reservoir grid model (290) described above in FIG. 2B and the accompanying description. Wells in the reservoir simulation of FIG. 3 may have well activity data (e.g., well activity data D (311), well activity data E (322), well activity data F (323), well activity data H (325), and well activity data I (326)) and/or production data (e.g., production data D (331), production data E (332), production data F (333), production data H (325), and production data I (326)). For more information on well activity data, see FIGS. 4, 5A, 5B, 5C, 5D, 5E, 6, and 7 below and the accompanying description.

Furthermore, a reservoir simulation may be divided into various parallel processing stages (e.g., parallel processing stage A (371), parallel processing stage B (372), parallel processing stage C (373)). In particular, a parallel processing stage may include multiples simulation processes that are performed approximately simultaneously using different computer processors. For example, in the parallel processing stage A (371), three historical wells are being modeled simultaneously, i.e., historical well D (311), historical well E (312), and historical well F (313). As such, the historical wells (311, 312, 313) may be modeled independently of each other within the parallel processing stage A (371) using reservoir model grid data A (390). In other words, calculations that are performed for the simulation of historical well D (311) may have no or little effect on the computation time of historical well F (313). As shown in FIG. 3, after completing the simulations for the parallel processing stage A (371), a reservoir simulator proceeds to parallel processing stage B (372), and finally a parallel processing stage C (373) to complete the reservoir simulation.

In regard to parallel processing stages, parallel processing stages may be implemented in a reservoir simulator using parallel computing. In particular, parallel computing may include the simultaneous use of multiple computer resources to solve a computational problem by dividing the computational problem into discrete parts, e.g., parallel processing stages, that may be solved concurrently. Thus, a reservoir simulator may coordinate instructions from each part of a reservoir simulation in order to execute the different parts simultaneously on different computer processors. More specifically, parallel computing may employ multiple technologies, such as bit-level parallelism, instruction-level parallelism, and task parallelism. With respect to parallel processing stages, a reservoir simulator may use the output of one parallel processing stage as an input to the subsequent parallel processing stage. In one example as shown in FIG. 3, the simulation output of the parallel processing stage A (371) may be used in simulating historical well G (314) and well H in a prediction phase (315) of parallel processing stage B (372).

In some embodiments, a reservoir simulation is divided into one or more historical periods (e.g., historical period X (381)) and/or one or more prediction periods (e.g., prediction period Y (382)). In the reservoir simulation shown in FIG. 3, for example, the historical period X (381) only simulates historical wells (311, 312, 313) that have production data (e.g., production data D (331), production data E (332), and production data F (333)). A prediction period may include historical wells (e.g., historical well D (311)) and/or wells in prediction phases (e.g., well H (315), well I (316)). In the prediction period Y (382) shown in FIG. 3, the prediction period Y (382) includes two parallel processing stages (372, 373) and uses the output of the historical period X (381) for simulating the wells (311, 315, 316). As shown in FIG. 3, historical well D (311) is located in both a historical period X (381) and the prediction period Y (382) of the reservoir simulation. Accordingly, the reservoir model grid data A (390) includes historical production data for historical well D (314) for only part of the reservoir simulation, because the prediction period Y (382) includes a time period located in the future.

Figure 4:
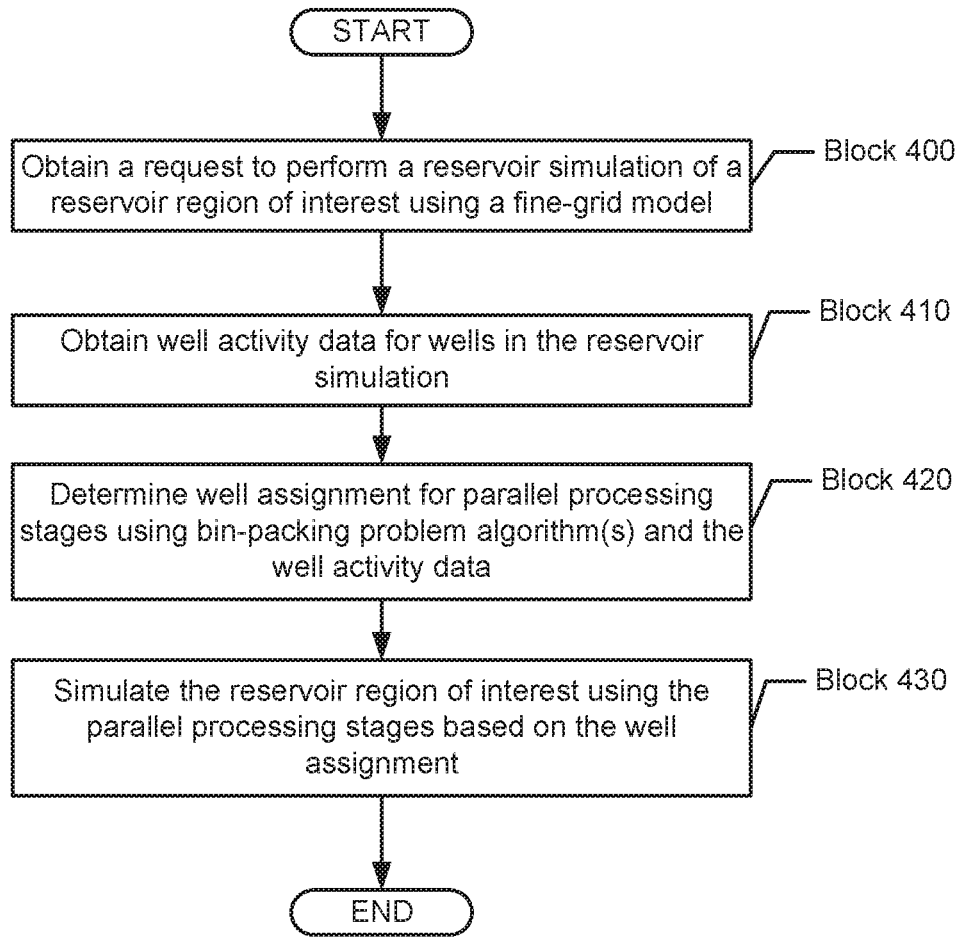
FIG. 4 shows a flowchart in accordance with one or more embodiments.

Turning to FIG. 4, FIG. 4 shows a flowchart in accordance with one or more embodiments. Specifically, FIG. 4 describes a general method for simulating a reservoir region of interest using a well assignment. One or more blocks in FIG. 4 may be performed by one or more components (e.g., reservoir simulator (160)) as described in FIGS. 1, 2B, and 3. While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 400, a request to perform a reservoir simulation of a reservoir region of interest using a fine-grid reservoir model is obtained in accordance with one or more embodiments. For example, a full-field fine-grid reservoir model may be submitted by a user for a reservoir simulation.

In Block 410, well activity data is obtained for various well in a reservoir simulation in accordance with one or more embodiments. In particular, a production well or an injection well may be active during certain periods of time in a simulation, while inactive in other periods of the simulation. When a production well is active, for example, the production well is acquiring hydrocarbon production from a reservoir. Thus, well activity data may describe periods of time that a particular well is active, e.g., as a predetermined amount of time between predetermined dates.

In some embodiments, well activity data is arranged according to a well activity mask. For example, a well activity mask may be a file that describes well activity using binary information at any given time, i.e., a well is either active by producing or injecting, or the well is inactive at an associated time step during the reservoir simulation. In some embodiments, rather than simply outputting whether a well is active or inactive, additional information may be registered in the well activity mask. Such details may include information such as the number of producing perforations at a given time or how much elapsed time a well took to be solved by a computational process. Accordingly, the well activity mask may include multiple parameters that describe well activity of a particular well for use by a bin-packing problem algorithm.

In regard to a historical well, well activity data may be logged while acquiring production data and/or other types of data with respect to well operations for the historical well. More specifically, if all the wells in a reservoir simulation are historical wells, the well activity data may be known in advance of the reservoir simulation. However, in regard to wells in prediction phases, the location of a well may be known prior to performing a reservoir simulation but the well's activity and/or inactive periods may not be known. For example, a well in a prediction phase may only become active after a different well becomes depleted within a reservoir simulation. Accordingly, well activity data for prediction phases may be acquired from one or more previous simulations of a reservoir region.

In some embodiments, a coarsened simulation is performed prior to performing the reservoir simulation in order to acquire well activity data. By performing one or more coarsened simulations, well activity may be estimated for multiple wells in advance of performing a fine-grid reservoir simulation. Likewise, in some embodiments, a previous run of a fine-grid simulation is used to determine well activity for Block 410. For more information on using a coarsened simulation to determine well activity, see Block 600 in FIG. 6 below and the accompanying description.

In Block 420, a well assignment is determined for various parallel processing stages using one or more bin-packing problem algorithms and well activity data in accordance with one or more embodiments. For example, various wells may be mapped to different parallel processing stages in a reservoir simulation. This mapping may be analyzed as a bin-packing problem where the well assignment is solved using a bin-packing problem algorithms. In particular, a bin-packing problem may be a problem in which a number of discrete items of different volumes are packed into a finite number of bins or containers. The arrangement of items within bins may be performed to minimize the total number of bins being used. Moreover, a bin-packing problem may be online or offline. For example, an online bin packing problem includes the situation where items are being increased throughout performance of an algorithm that solves the online bin packing problem.

In regard to well assignment within a reservoir simulation, the total number of future well items may be unknown to a solving algorithm. In an offline bin-packing problem, the total number of well items may be known in advance of an algorithm determining a solution the bin-packing problem. As such, in some embodiments, a bin-packing problem algorithm provides an intelligent assignment of wells to various parallel processing stages within a reservoir simulation to ensure that the computational load (e.g., number of production wells within a computer process at a particular time) is distributed evenly or within a predetermined threshold.

Keeping with Block 420, a bin-packing problem algorithm may provide a combinatorial optimization method that balances well activity over the number of computer processors performing a reservoir simulation. Accordingly, the number of wells may be maximized for each processing stage, while minimizing the number of parallel processing stages in the reservoir simulation. By distributing simulated wells more evenly across various computer processors according to an optimized well assignment, runtime may be reduced for a reservoir simulation while obtaining similar simulation results. Thus, the computational load of a reservoir simulation may be reduced, thus enabling evaluation of more realizations, uncertainty analyses, and/or obtaining simulation results in a timely manner.

Turning to FIGS. 5A, 5B, 5C, 5D, and 5E, FIGS. 5A, 5B, 5C, 5D, and 5E provide examples of using different bin-packing problem algorithms to determine well assignments. The following examples are for explanatory purposes only and not intended to limit the scope of the disclosed technology.

Figure 5A:
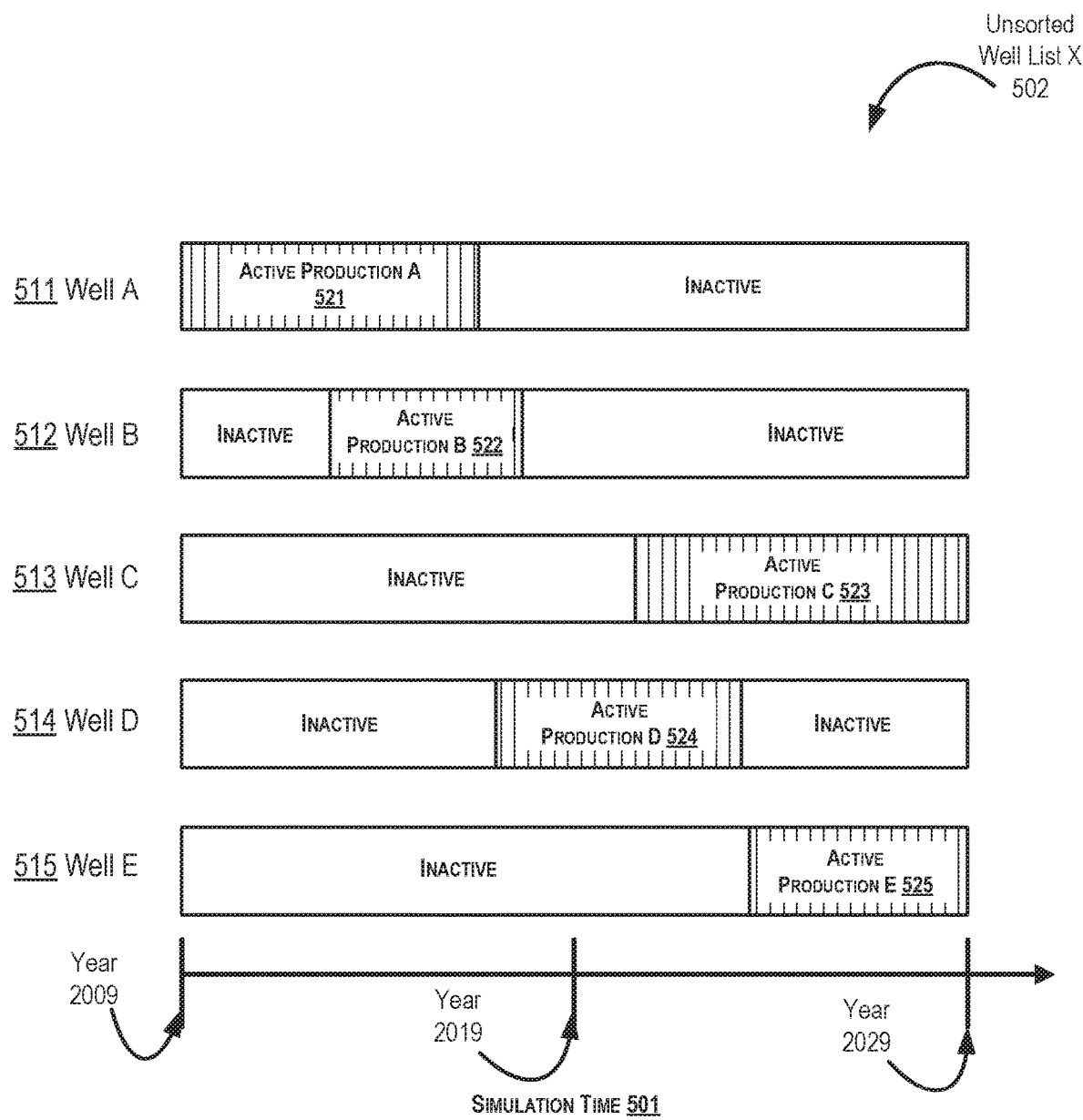
FIGS. 5A, 5B, 5C, 5D, and 5E show examples in accordance with one or more embodiments.

Turning to FIG. 5A, FIG. 5A illustrates an unsorted well list X (502) that includes various wells (i.e., well A (511), well B (512), well C (513), well D (514), well E (515)) that are modeled in a reservoir simulation. In particular, various well activities (i.e., active production A (521), active production B (522), active production C (523), active production D (524), active production E (525) correspond to whether a respective well is active during a segment of the entire simulation time (501). Likewise, the simulation time (501) may be represented as an empty rectangle from Year 2009 to Year 2029 along the y-axis, where a well activity block is disposed within the empty rectangle. Throughout the simulation time (501), the wells (511, 512, 513, 514, 515) are active for different time periods depicted with varying horizontal lengths. As such, FIG. 5A presents a well assignment problem for performing a reservoir simulation that may be equivalent to an offline, one-dimensional bin-packing problem. In this one-dimensional bin packing problem, well activity for the wells (511, 512, 513, 514, 515) cannot be shifted horizontally and only placed together in the same bin with no overlapping well activity.

Figure 5B:
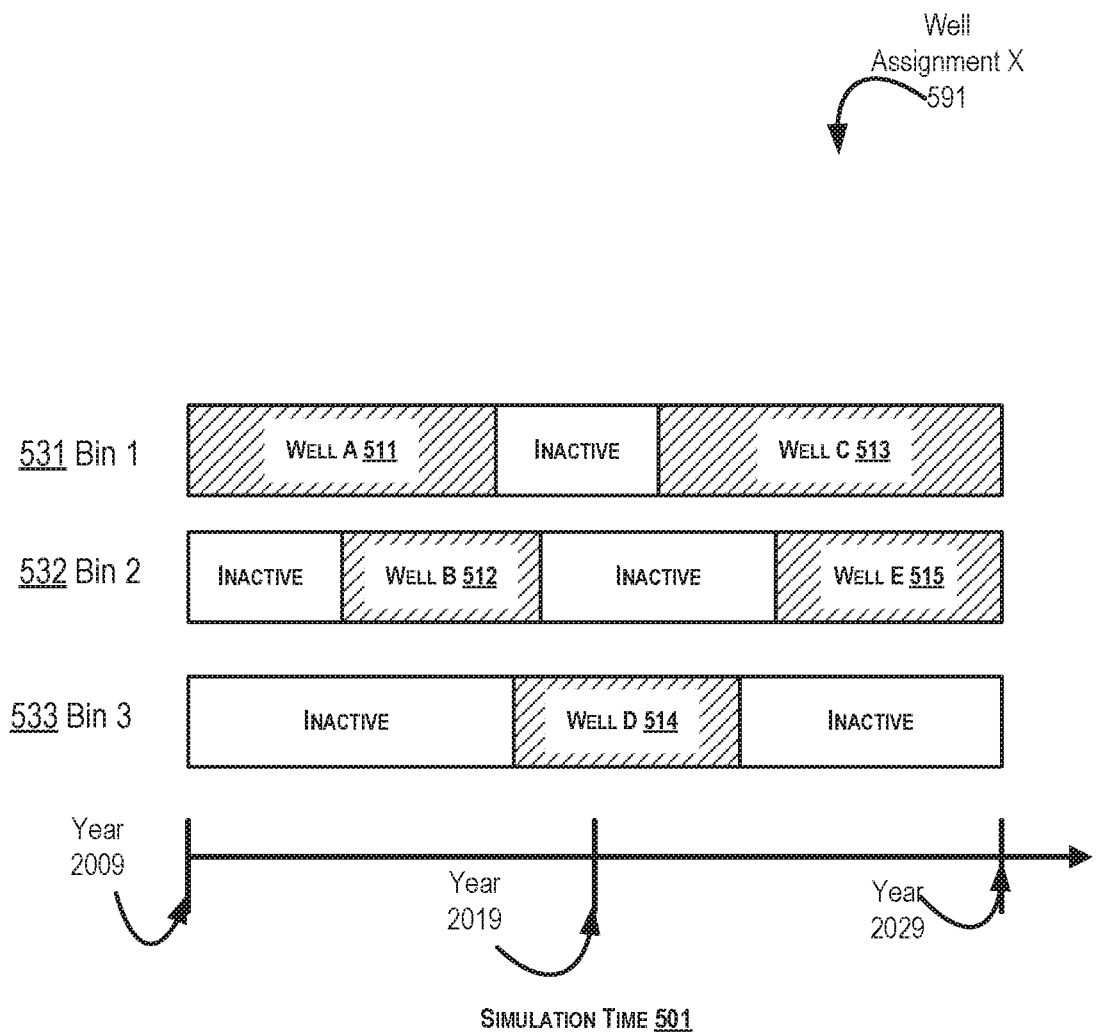

Turning to FIG. 5B, FIG. 5B shows a well assignment X (591) based on a First-fit algorithm that is applied to the unsorted well list X (502) using the respective well activity (521, 522, 523, 524, 525). The output of the First-fit algorithm is a First-fit well assignment X (591) that generates three total bins, i.e., bin 1 (531), bin 2 (532), and bin 3 (533). During the execution of the First-fit algorithm, well A (511) is initially evaluated, where no bins exist in well assignment X (591). Bin 1 (531) is subsequently generated and well A (511) is placed into the bin. Well B (512) does not fit into bin 1 (531) with well A (511). Thus, bin 2 (532) is generated to include well B (512). Next, well C (513) fits inside bin 1 (531) alongside well A (511). In the next step in the First-fit algorithm, well D (514) fails to fit inside bin 1 (531) and bin 2 (532). Accordingly, the algorithm generates bin 3 (533), where well D (514) is disposed as the only well item within bin 3 (533). Well E (515) fits inside bin 2 (532) with well B (512). Accordingly, the final well assignment X (591) includes three bins as shown in FIG. 5B.

Figure 5C:
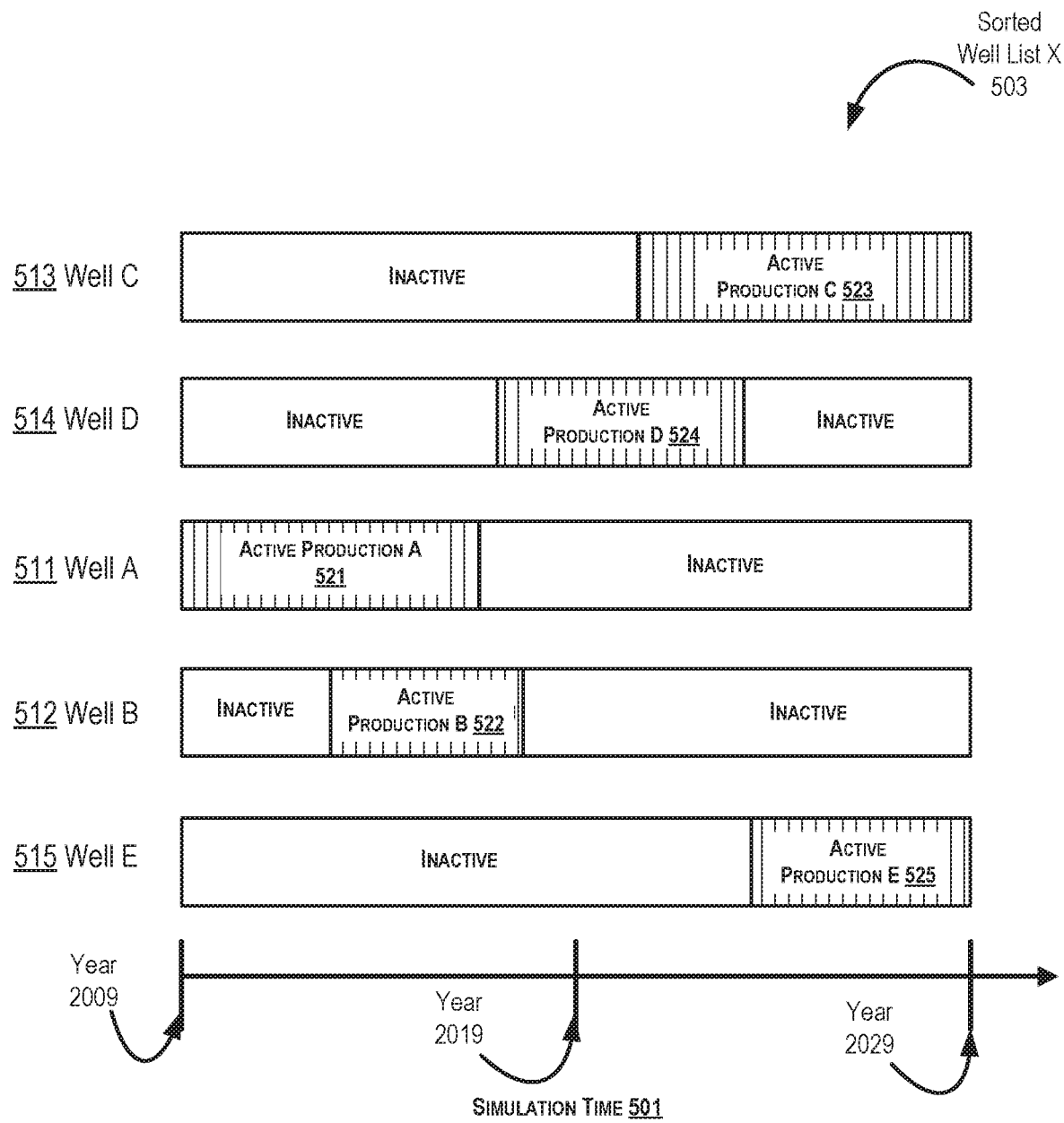

Turning to FIG. 5C, FIG. 5C illustrates a sorted well list X (503), where the unsorted well list X (502) is sorted based on a descending order of well activity. For example, the sorted well list X (503) may be a step in performing a First-fit decreasing algorithm to the wells (511, 512, 513, 514, 515). In another example, the unsorted well list X (502) may be sorted in an ascending order of well activity, e.g., where a First-fit increasing algorithm is being applied to the wells (511, 512, 513, 514, 515).

Figure 5D:
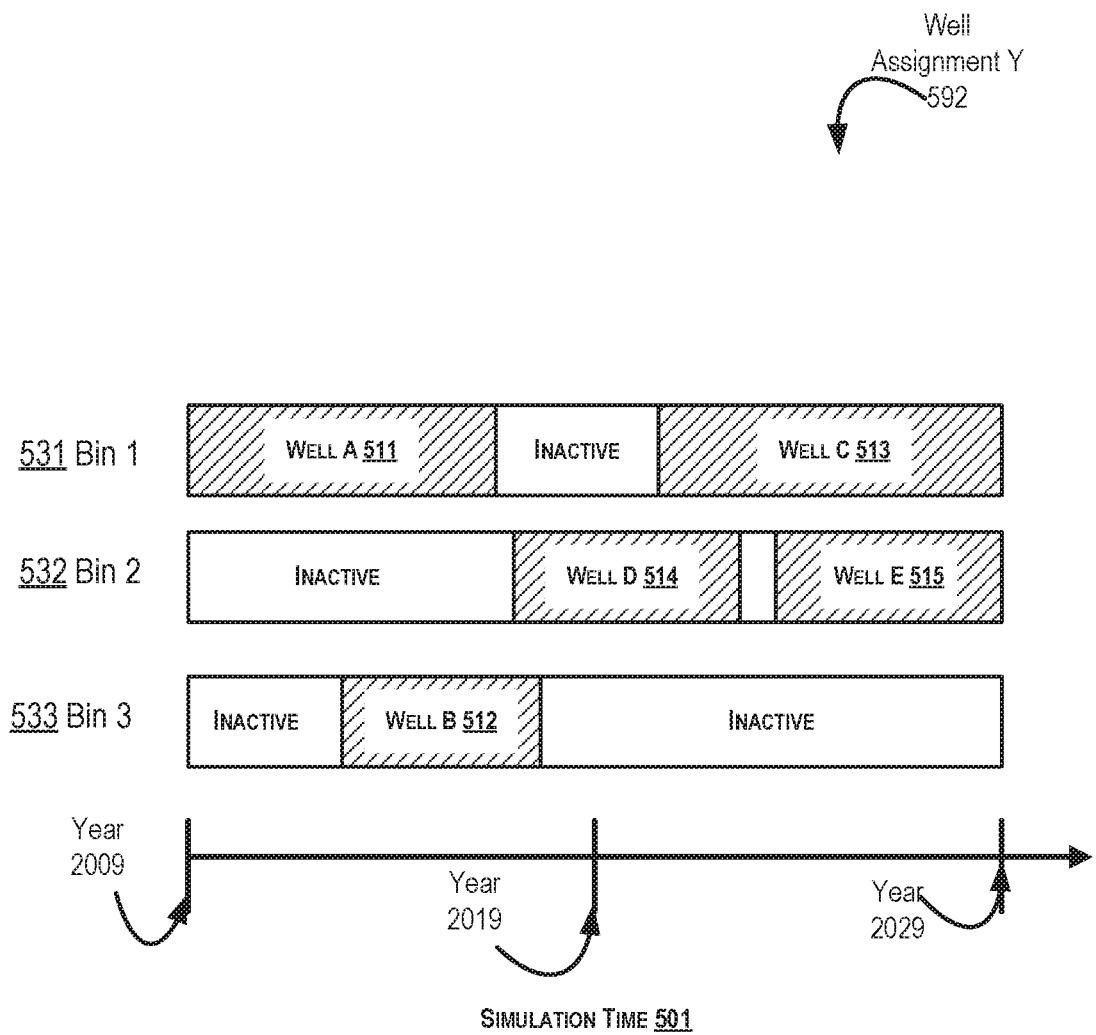

Turning to FIG. 5D, FIG. 5D shows a well assignment Y (592) based on a First-fit decreasing algorithm that is applied to the sorted well list X (503) using the respective well activity (521, 522, 523, 524, 525). The output of the First-fit decreasing algorithm is a well assignment Y (592) that generates three total bins, i.e., bin 1 (531), bin 2 (532), and bin 3 (533). During the execution of the First-fit decreasing algorithm, well C (511) is initially evaluated, where no bins exist in well assignment Y (592). Bin 1 (531) is subsequently generated and well C (513) is placed into the bin. Well D (514) does not fit into bin 1 (531) with well C (513). Thus, bin 2 (532) is generated to include well D (514). Next, well A (511) fits inside bin 1 (531) alongside well C (513). In the next step in the First-fit decreasing algorithm, well B (512) fails to fit inside bin 1 (531) and bin 2 (532). Accordingly, the algorithm generates bin 3 (533), where well B (512) is disposed as the only well item within bin 3 (533). Well E (515) fits inside bin 2 (532) with well D (514). Accordingly, the final well assignment Y (592) includes three bins as shown in FIG. 5D.

Figure 5E:
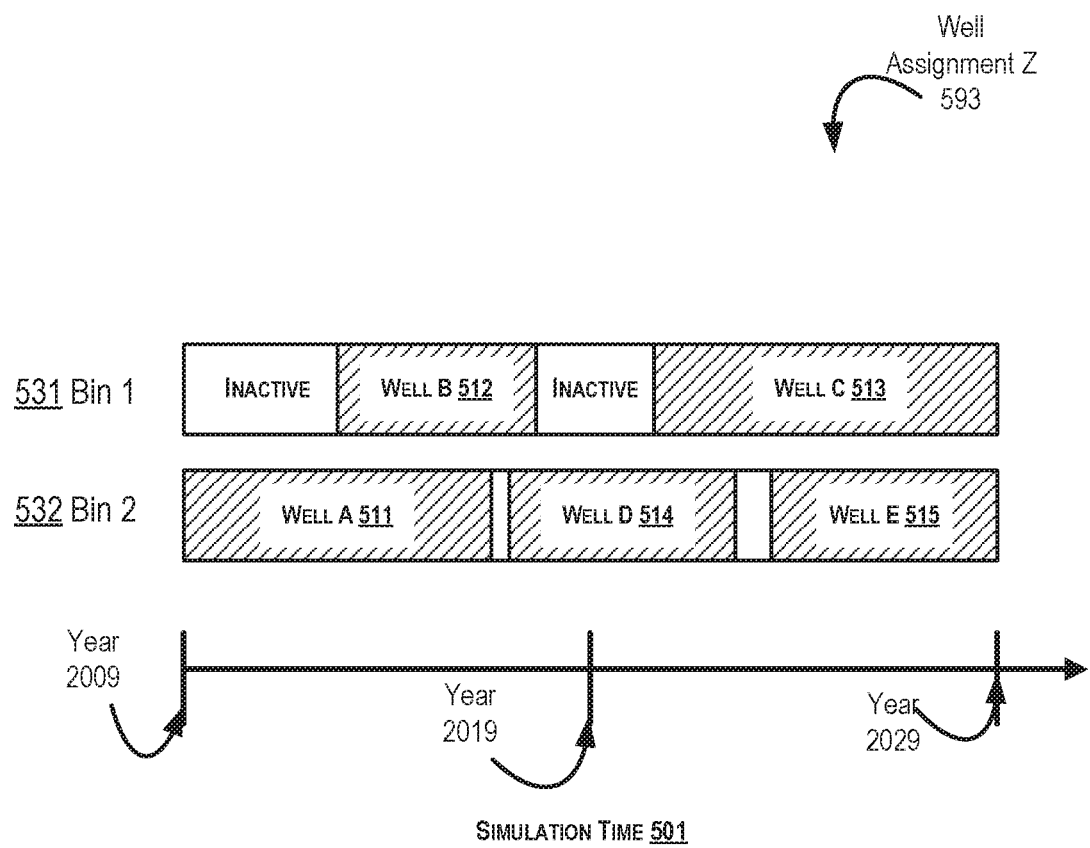

Turning to FIG. 5E, FIG. 5E shows a well assignment Z (593) based on a Best-fit algorithm that is applied to unsorted well list X (502) using the respective well activity (521, 522, 523, 524, 525). A Best-fit algorithm may minimize inactive simulation time within respective bins. As shown in FIG. 5E, inactive simulation time is minimized and eliminated between several wells altogether. Thus, the Best-fit algorithm places well A (511), well D (514), and well E (515) in the same bin (i.e., bin 2 (532)) with very little inactive simulation time. Likewise, the Best-fit algorithm places well B (512) and well C (513) in bin 1 (531), which results in some inactive simulation time within bin 1 (531). Accordingly, well assignment Z (593) produced by the Best-fit algorithm results in using two bins and thus may be the optimal solution in contrast to well assignment X (591) and well assignment Y (592).

Returning to FIG. 4, in Block 440, a reservoir region of interest is simulated using various parallel processing stages based on a well assignment in accordance with one or more embodiments. Using the parallel processing stages, a reservoir simulation may be performed in a similar manner as shown in FIG. 3 and the accompanying description. Accordingly, a reservoir simulation may be used to predict production at a new well coupled to the reservoir region of interest. Likewise, a reservoir simulator may model various injection wells in the reservoir region of interest to determine an amount of production enhanced by the injection wells.

Figure 6:
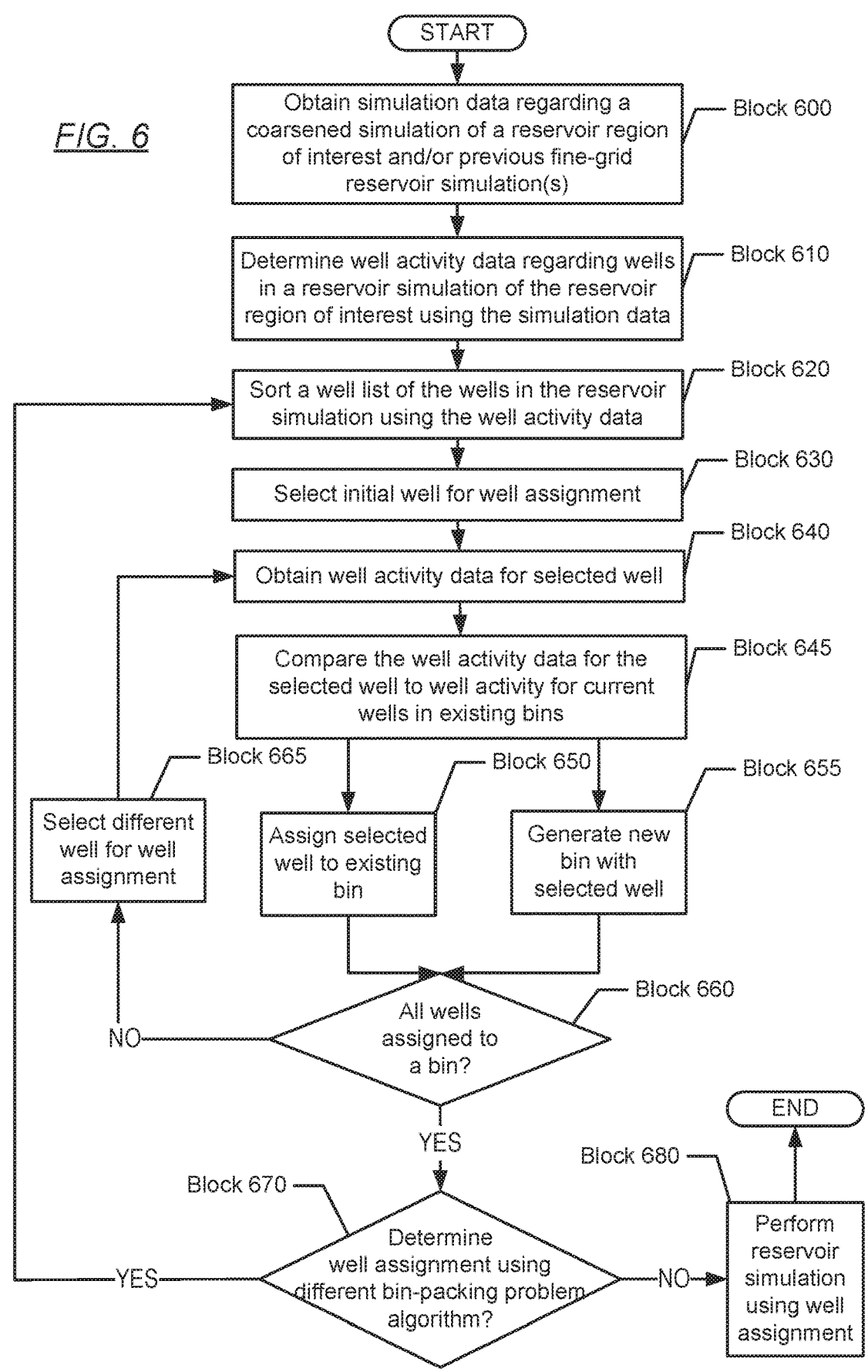
FIG. 6 shows a flowchart in accordance with one or more embodiments.

Turning to FIG. 6, FIG. 6 shows a flowchart in accordance with one or more embodiments. Specifically, FIG. 6 describes a specific method for performing a reservoir simulation using a well assignment. One or more blocks in FIG. 6 may be performed by one or more components (e.g., reservoir simulator (160)) as described in FIGS. 1, 2B, and 3. While the various blocks in FIG. 6 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 600, simulation data is obtained regarding a coarsened simulation of a reservoir region of interest and/or one or more previous fine-grid reservoir simulations in accordance with one or more embodiments. For example, a reservoir simulator may analyze simulation data from a coarsened simulation and/or a previous run of a fine-grid reservoir simulation. In doing so, the reservoir simulator may use the simulation data to predict well activity during prediction periods of a different reservoir simulation.

In some embodiments, for example, a coarsened model of the reservoir region of interest is automatically generated in response to a request to perform a reservoir simulation by a user. As such, a coarsened simulation using a coarsened model may be used to predict well activity that occurs in a later fine-grid model for a similar reservoir region of interest. As such, coarsened models may provide a reservoir simulator with the ability to foresee well activity of wells in prediction phases and historical wells in a prediction period of a reservoir simulation. Likewise, a reservoir region of interest may be analyzed to determine the coarsening details for the coarsened simulation that produce a coarsened model with the lowest grid resolution capable of preserving similar well behavior in a fine-grid model.

In some embodiments, multiple coarsened models with different levels of grid block resolution are used to predict well activity, e.g., in order optimize the computational size and runtime of the well activity prediction. In one embodiment, for example, two coarsened models are used where the first coarsened model captures details of the historical wells which are active during a history period of a reservoir simulation, while coarsening the wells in prediction phases. The first coarsened model may output well activity of the historical wells for use in a fine-grid reservoir simulation during a history period. The second coarsened model may generate well activity regarding the wells in prediction phases for guiding the fine-grid model during the corresponding prediction period of the simulation.

In Block 610, well activity data is determined regarding wells in a reservoir simulation of a reservoir region of interest using simulation data in accordance with one or more embodiments. In particular, a reservoir simulator may obtain well activity data for wells in a reservoir simulation as discussed above in Blocks 410 and 600 and the accompanying description.

In some embodiments, the historical well activity is parsed from a well rate history file. Thus, a fine-grid model and a coarsened model may be run in parallel, while the wells may be repartitioned in a different fine-grid model at the beginning of a prediction period. Thus, the well activity acquired by a coarsened model may be ready when the fine-grid model arrives at the prediction period during a reservoir simulation. However, if the coarsened model has not finished when the fine-grid model enters the prediction period, a reservoir simulator may repartition the fine-grid model based on the latest data available in the coarsened model. Likewise, a reservoir simulator may also start the prediction period with the same history partitioning and delay the repartitioning in the fine-grid model to a later moment in time.

In Block 620, a well list of wells in a reservoir simulation is sorted using well activity data in accordance with one or more embodiments. In particular, historical wells and/or wells in prediction phases in a reservoir simulation may be include in a list. For example, the well list may be static where wells in the well list do not change during the reservoir simulation. On the other hand, the well list may be dynamic such that wells are added and/or removed from the well list during a reservoir simulation. Depending on the type of bin-packing problem algorithm being used to generate a well assignment, the well list may be sorted in Block 620 or Block 620 may be skipped if an unsorted list is used in the method described in FIG. 6. For example, Block 620 may be optional where a First-fit algorithm is being applied to the well list. For more examples of well lists, see FIGS. 5A and 5C above and the accompanying description.

Furthermore, a well list may be sorted in increasing or decreasing order based on the well activity of a respective well in the well list. For example, wells may be weighted equally during a sorting, while in some embodiments, various well features may be assigned particular weight, such as well type (e.g., production wells, injection wells, horizontal wells, onshore and offshore wells, etc.).

In Block 630, an initial well is selected for well assignment in accordance with one or more embodiments. Where a well list is used, for example, a reservoir simulator may select the first well in the well list as the initial well.

In Block 640, well activity data is obtained for a selected well in accordance with one or more embodiments. A reservoir simulator may obtain well activity obtained in Block 610 above for the well currently selected within the present iteration of Blocks 620-660. This well activity may be used for further analysis by a bin-packing problem algorithm in the following Block 645.

In Blocks 645, 650, and 655, a bin-packing problem may assign the selected well to an existing bin or generate a new bin for the selected well, depending on the well activity associated with the selected well.

In Block 645, well activity data for a selected well is compared to wells in existing bin in accordance with one or more embodiments. Here, a bin-packing problem algorithm may compare well activity of the selected well to existing bins to determine which bin to assign the selected well. Likewise, the bin-packing problem algorithm may also compare other criteria of a selected well with the wells already assigned to bins. For example, some wells may require greater computational resources to solve based on geological properties associated with a region around the well, the type of data available for the particular well (e.g., seismic data and well log data), and other characteristics that may affect the reservoir simulation. Thus, the bin-packing problem may perform one or more comparisons to identify whether to generate a new bin for the selected well or assign the selected well to an existing bin. Accordingly, the method described in FIG. 6 may proceed to either Block 650 or Block 655 from Block 645.

In Block 650, a selected well is assigned to an existing bin in accordance with one or more embodiments. Based on the comparison of Block 645, for example, a bin-packing problem algorithm may assign the selected well to an existing bin.

In Block 655, a new bin is generated with a selected well in accordance with one or more embodiments. Based on the comparison of Block 645, for example, a bin-packing problem algorithm may generate a new bin for the selected well.

In Block 660, a determination is made whether all wells are assigned to a bin in accordance with one or more embodiments. For example, a reservoir simulator may analyze a well list to confirm if any wells remain to be assigned by the bin-packing algorithm. Likewise, if an online bin-packing problem algorithm is being performed, one or more wells may have been added to a well list. Once all wells have been assigned to a bin, a reservoir simulator may accordingly finalize a well assignment. When a determination is made that no wells remain to be selected for the bin-packing problem algorithm, the process may proceed to Block 670. When a determination is made that one or more wells remain to be assigned to a bin, the process may return to Block 665.

In Block 665, a different well is selected for a well assignment in accordance with one or more embodiments. For example, a bin-packing problem algorithm may select the next well in a well list.

In Block 670, a determination is made whether to determine a well assignment using a different bin-packing problem algorithm in accordance with one or more embodiments. For example, several different bin-packing problem algorithms may be performed on a particular well list. Accordingly, a reservoir simulator may perform a comparison of the well assignment results of different bin-packing problem algorithms. For example, a reservoir simulator may compare the total number of bins generated by different bin-packing problem algorithms. Thus, total number of bins, average length of inactive periods within bins, and other parameters may be analyzed in order to optimize a reservoir simulation. Accordingly, a reservoir simulator may determine two or more bin-packing problem algorithms to apply to wells and well activity to determine an optimized reservoir simulation.

When a determination is made that another bin-packing problem is to be performed on wells for a reservoir simulation, the process may return to Block 620 or Block 630 if the bin-packing problem does not require sorting. When a determination is made that no more bin-packing problem algorithms need to be applied to the wells, the process may proceed to Block 680.

In Block 680, a reservoir simulation is performed using a well assignment in accordance with one or more embodiments. Based on which well assignment from one or more bin-packing problem algorithms provides a particular desired performed, that well assignment may be used to perform a reservoir simulation.

In some embodiments, the processes described above in FIGS. 4 and 6 may be used to minimize overlap between well activity rather than avoid all overlap. For example, a bin-packing problem algorithm may use various weights regarding wells when generating new bins and/or assigning wells to existing bins to minimize overlap. Likewise, a reservoir simulator may place various thresholds on the amount of overlap between wells, e.g., an overlap period may not exceed a specific time duration.

Figure 7:
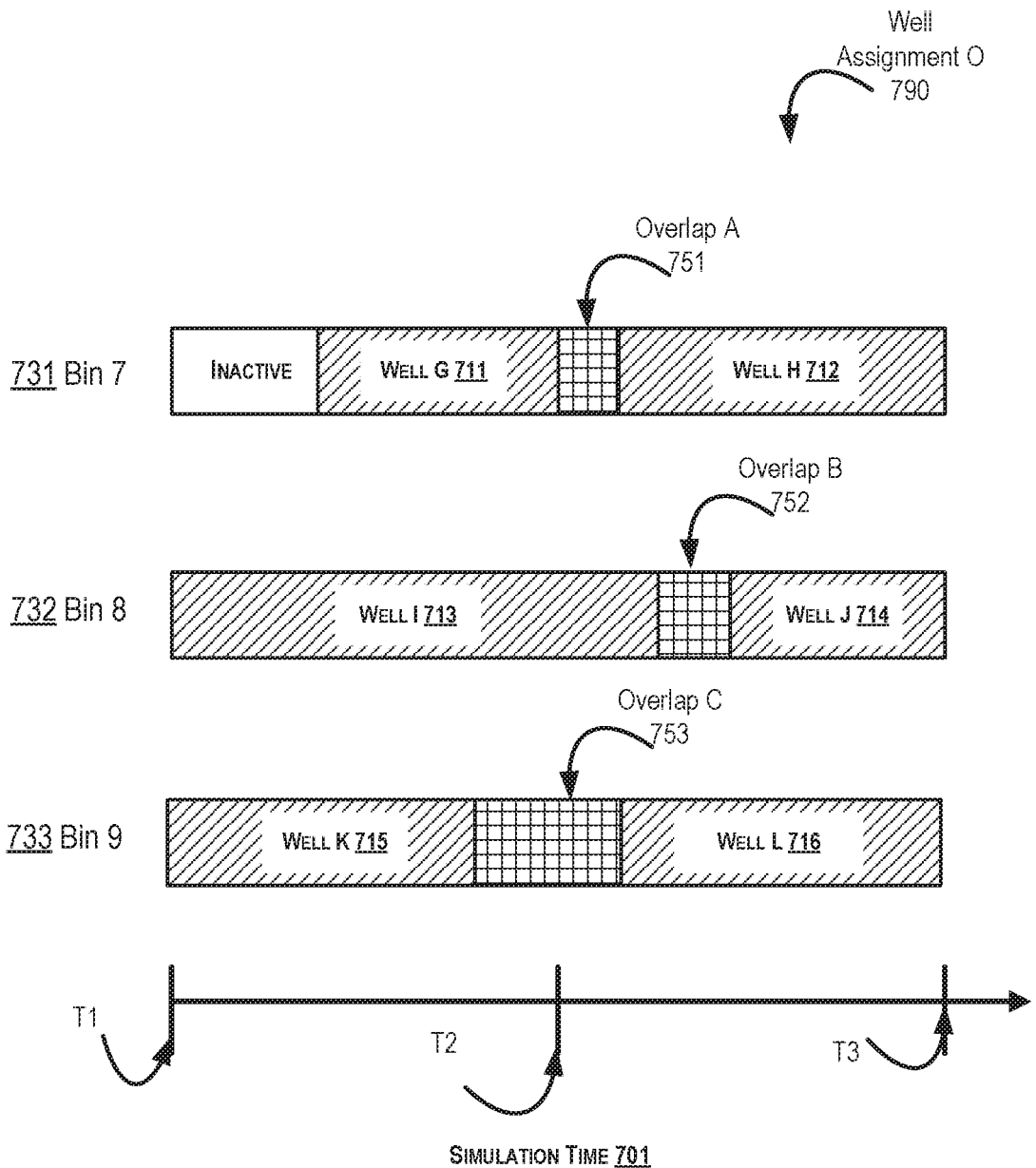
FIG. 7 shows an example in accordance with one or more embodiments.

Turning to FIG. 7, FIG. 7 illustrates an example of a well assignment with overlap in accordance with one or more embodiments. As shown in FIG. 7, FIG. 7 illustrates a well assignment O (790) over simulation time (701) that includes three bins, i.e., bin 7 (731), bin 8 (732), and bin 9 (733). In bin 7 (731), well activity of well G (711) has an overlap A (751) with the well activity of well H (712). In bin 8 (732), well activity of well I (713) has an overlap B (752) with well J (714). In bin 9 (733), well K (715) has an overlap C (753) with well L (716).

Figure 8A:
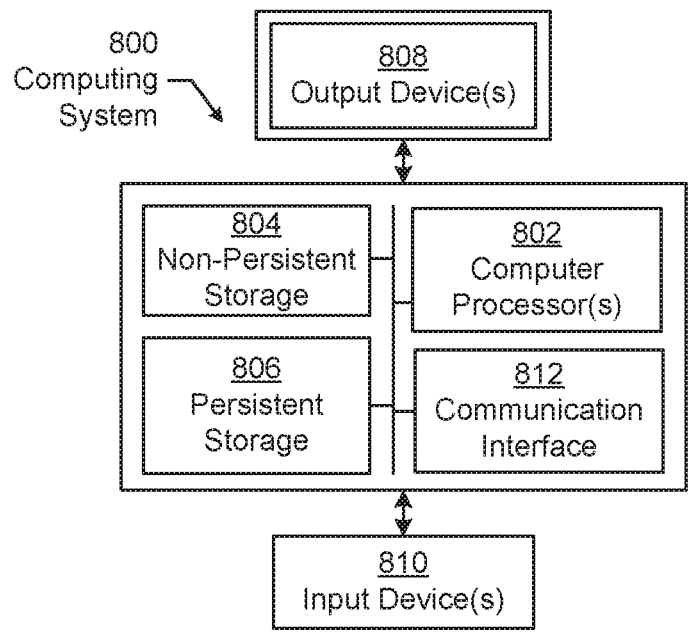
FIGS. 8A and 8B show a computing system in accordance with one or more embodiments.

Embodiments may be implemented on a computing system. Any combination of mobile, desktop, server, router, switch, embedded device, or other types of hardware may be used. For example, as shown in FIG. 8A, the computing system (800) may include one or more computer processors (802), non-persistent storage (804) (e.g., volatile memory, such as random access memory (RAM), cache memory), persistent storage (806) (e.g., a hard disk, an optical drive such as a compact disk (CD) drive or digital versatile disk (DVD) drive, a flash memory, etc.), a communication interface (812) (e.g., Bluetooth interface, infrared interface, network interface, optical interface, etc.), and numerous other elements and functionalities.

The computer processor(s) (802) may be an integrated circuit for processing instructions. For example, the computer processor(s) may be one or more cores or micro-cores of a processor. The computing system (800) may also include one or more input devices (810), such as a touchscreen, keyboard, mouse, microphone, touchpad, electronic pen, or any other type of input device.

The communication interface (812) may include an integrated circuit for connecting the computing system (800) to a network (not shown) (e.g., a local area network (LAN), a wide area network (WAN) such as the Internet, mobile network, or any other type of network) and/or to another device, such as another computing device.

Further, the computing system (800) may include one or more output devices (808), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (802), non-persistent storage (804), and persistent storage (806). Many different types of computing systems exist, and the aforementioned input and output device(s) may take other forms.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure.

Figure 8B:
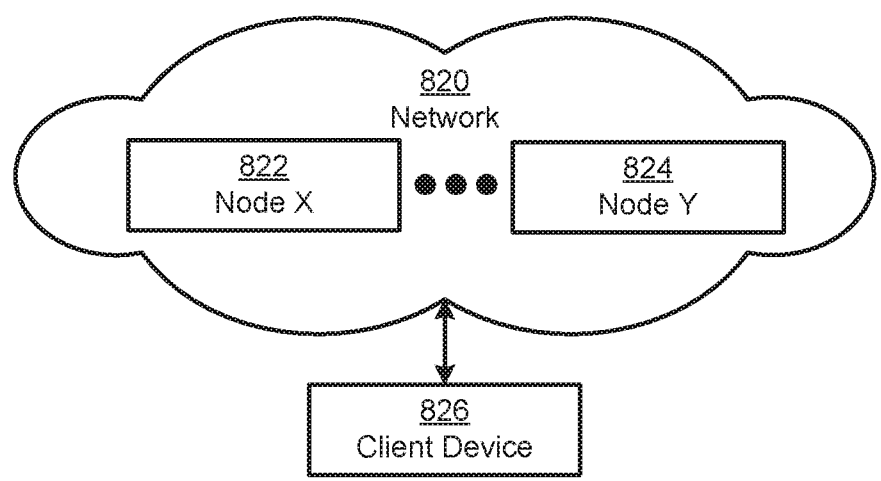

The computing system (800) in FIG. 8A may be connected to or be a part of a network. For example, as shown in FIG. 8B, the network (820) may include multiple nodes (e.g., node X (822), node Y (824)). Each node may correspond to a computing system, such as the computing system shown in FIG. 8A, or a group of nodes combined may correspond to the computing system shown in FIG. 8A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system (800) may be located at a remote location and connected to the other elements over a network.

Although not shown in FIG. 8B, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (822), node Y (824)) in the network (820) may be configured to provide services for a client device (826). For example, the nodes may be part of a cloud computing system. The nodes may include functionality to receive requests from the client device (826) and transmit responses to the client device (826). The client device (826) may be a computing system, such as the computing system shown in FIG. 8A. Further, the client device (826) may include and/or perform all or a portion of one or more embodiments of the disclosure.

The computing system or group of computing systems described in FIGS. 8A and 8B may include functionality to perform a variety of operations disclosed herein. For example, the computing system(s) may perform communication between processes on the same or different systems. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until the server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, one authorized process may mount the shareable segment, other than the initializing process, at any given time.

Other techniques may be used to share data, such as the various data described in the present application, between processes without departing from the scope of the disclosure. The processes may be part of the same or different application and may execute on the same or different computing system.

Rather than or in addition to sharing data between processes, the computing system performing one or more embodiments of the disclosure may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments of the disclosure, may extract one or more data items from the obtained data. For example, the extraction may be performed as follows by the computing system (800) in FIG. 8A. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail—such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 8A, while performing one or more embodiments of the disclosure, may perform data comparison. Data comparison may be used to compare two or more data values (e.g., A, B). For example, one or more embodiments may determine whether A>B, A=B, A !=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments of the disclosure, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 8A may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 8A may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions presents only a few examples of functions performed by the computing system of FIG. 8A and the nodes and/or client device in FIG. 8B. Other functions may be performed using one or more embodiments of the disclosure.

While the disclosure has been described with respect to a limited number of embodiments, those skilled in the art, having benefit of this disclosure, will appreciate that other embodiments can be devised which do not depart from the scope of the disclosure as disclosed herein. Accordingly, the scope of the disclosure should be limited only by the attached claims.

Although the preceding description has been described herein with reference to particular means, materials and embodiments, it is not intended to be limited to the particulars disclosed herein; rather, it extends to all functionally equivalent structures, methods and uses, such as are within the scope of the appended claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A method, comprising:
   obtaining, by a computer processor, well activity data regarding a plurality wells in a reservoir region of interest;
   determining, by the computer processor, a first predetermined well assignment for a plurality of parallel processing stages using a first bin-packing problem algorithm and the well activity data,
      wherein the first predetermined well assignment assigns the plurality of wells to the plurality of parallel processing stages based on the application of the first bin-packing problem algorithm to the well activity data associated with each well, and
      wherein a respective parallel processing stage among the plurality of parallel processing stages performs a portion of a reservoir simulation using a respective computer processor and one or more wells among the plurality of wells; and
   simulating, by the computer processor, the reservoir region of interest based on the plurality of wells being simulated according the first predetermined well assignment for the plurality of parallel processing stages.

2. The method of claim 1, further comprising:
   performing a coarsened simulation of the reservoir region of interest for the plurality of wells prior to determining the first predetermined well assignment, and
   wherein the well activity data for determining the first predetermined well assignment is obtained from the coarsened simulation.

3. The method of claim 1, wherein the first bin-packing problem algorithm is a First-fit (FF) algorithm, a Next-fit (NF) algorithm, a First-fit Decreasing (FFD) algorithm, a First-fit Increasing (FFI) algorithm, or a Best-fit (BF) algorithm.

4. The method of claim 1,
   wherein the first bin-packing problem algorithm assigns the plurality of wells to a plurality of bins that minimizes an amount of inactive time within the plurality of bins, and
   wherein the amount of inactive time corresponds to time within a parallel processing stage when a parallel process is not simulating production of a well among the plurality of wells.

5. The method of claim 1, further comprising:
generating a first bin for a first well;
generating a second bin for a second well in response to determining that the second well fails to fit with the first well;
assigning a third well to the first bin in response to determining that the third well fits with the first well inside the first bin;
generating a third bin for a fourth well in response determining that the fourth well fails to fit inside the first bin and the second bin; and
assigning a fifth well to the second bin in response to determining that the fifth well fails to fit inside the first bin with the first well and fits inside the second bin with the second well.

6. The method of claim 5,
wherein the first well, the second well, the third well, the fourth well, and the fifth well are respective wells in a predetermined well list for the reservoir simulation.

7. The method of claim 1, further comprising:
sorting the plurality of wells using the well activity data to produce a sorted well list, the plurality of wells comprising a first well, a second well, a third well, a fourth well, and a fifth well according to respective well activity sizes,
wherein, within the sorted well list, the third well is greater than the fourth well that is greater than the first well that is greater than the second well that is greater than the fifth well;
generating a first bin for the third well in response to the third well being assigned initially from the sorted well list;
generating a second bin for the fourth well in response to determining that the fourth well fails to fit inside the first bin;
assigning the first well to the first bin in response to determining that the first well fits inside the first bin;
generating a third bin for the second well in response determining that the second well fails to fit inside the first bin and the second bin; and
assigning the fifth well to the second bin in response to determining that the fifth well fails to fit inside the first bin and fits inside the second bin with the second well.

8. The method of claim 1,
wherein the plurality of wells comprise a plurality of historical wells and a plurality of wells in prediction phases,
wherein the plurality of historical wells are simulated by the reservoir simulation using production data acquired at the plurality of historical wells, and
wherein the plurality of wells in prediction phases are simulated by the reservoir simulation without using production data.

9. The method of claim 8, further comprising:
generating a coarsened model that simulates the plurality of wells in prediction phases; and
generating a fine-grid model that simulates the plurality of historical wells,
wherein the coarsened model corresponds to a plurality of grid blocks with a first grid resolution that is less than a second grid resolution of the fine-grid model.

10. The method of claim 1, further comprising:
determining a second predetermined well assignment for the plurality of parallel processing stages using the well activity data and a second bin-packing problem algorithm that is different from the first bin-packing problem; and
comparing a first number of bins that is determined from the first well assignment with a second number of bins that is determined from the second well assignment, and
wherein the plurality of wells are simulated using the first well assignment in response to determining that the first number of bins is less than the second number of bins.

11. The method of claim 1,
wherein the plurality of parallel processing stages comprises a first parallel processing stage and a second parallel processing stage,
wherein the first parallel processing stage is a historical period of the reservoir simulation, and
wherein the second parallel processing stage is a prediction period of the reservoir simulation.

12. The method of claim 1,
wherein the plurality of wells comprise a first well, a second well, and a third well,
wherein the first well, the second well, and the third well are arranged in a single bin within the predetermined well assignment,
wherein the bin comprises an inactive period between the first well and the second well, and
wherein the bin comprises an overlap region between the second well and the third well.

13. A computer system, comprising:
a processor; and
a memory coupled to the processor, the memory comprising functionality for:
obtaining well activity data regarding a plurality wells in a reservoir region of interest;
determining a predetermined well assignment for a plurality of parallel processing stages using a bin-packing problem algorithm and the well activity data,
wherein the predetermined well assignment assigns the plurality of wells to the plurality of parallel processing stages based on the application of the bin-packing problem algorithm to the well activity data associated with each well, and
wherein a respective parallel processing stage among the plurality of parallel processing stages performs a portion of a reservoir simulation using a respective computer processor and one or more wells among the plurality of wells; and
simulating the reservoir region of interest based on the plurality of wells being simulated according the predetermined well assignment for the plurality of parallel processing stages.

14. The computer system of claim 13,
wherein the first bin-packing problem algorithm assigns the plurality of wells to a plurality of bins that minimizes an amount of inactive time within the plurality of bins, and
wherein the amount of inactive time corresponds to time within a parallel processing stage when a parallel process is not simulating production of a well among the plurality of wells.

15. The computer system of claim 13, wherein the memory further comprises functionality for:
performing a coarsened simulation of the reservoir region of interest for the plurality of wells prior to determining the first predetermined well assignment, and
wherein the well activity data for determining the first predetermined well assignment is obtained from the coarsened simulation.

16. The computer system of claim 13,
wherein the plurality of wells comprise a plurality of historical wells and a plurality of wells in prediction phases,
wherein the plurality of historical wells are simulated by the reservoir simulation using production data acquired at the plurality of historical wells, and
wherein the plurality of wells in prediction phases are simulated by the reservoir simulation without using production data.

17. A non-transitory computer readable medium storing instructions executable by a computer processor, the instructions comprising functionality for:
obtaining well activity data regarding a plurality wells in a reservoir region of interest;
determining a predetermined well assignment for a plurality of parallel processing stages using a bin-packing problem algorithm and the well activity data,
wherein the predetermined well assignment assigns the plurality of wells to the plurality of parallel processing stages based on the application of the bin-packing problem algorithm to the well activity data associated with each well, and
wherein a respective parallel processing stage among the plurality of parallel processing stages performs a portion of a reservoir simulation using a respective computer processor and one or more wells among the plurality of wells; and
simulating the reservoir region of interest based on the plurality of wells being simulated according the predetermined well assignment for the plurality of parallel processing stages.

18. The non-transitory computer readable medium of claim 17,
wherein the first bin-packing problem algorithm assigns the plurality of wells to a plurality of bins that minimizes an amount of inactive time within the plurality of bins, and
wherein the amount of inactive time corresponds to time within a parallel processing stage when a parallel process is not simulating production of a well among the plurality of wells.

19. The non-transitory computer readable medium of claim 17, wherein the instructions further comprise functionality for:
performing a coarsened simulation of the reservoir region of interest for the plurality of wells prior to determining the first predetermined well assignment, and
wherein the well activity data for determining the first predetermined well assignment is obtained from the coarsened simulation.

20. The non-transitory computer readable medium of claim 17, wherein the instructions further comprise functionality for:
sorting the plurality of wells using the well activity data to produce a sorted well list, the plurality of wells comprising a first well, a second well, a third well, a fourth well, and a fifth well according to respective well activity sizes,
wherein, within the sorted well list, the third well is greater than the fourth well that is greater than the first well that is greater than the second well that is greater than the fifth well;
generating a first bin for the third well in response to the third well being assigned initially from the sorted well list;
generating a second bin for the fourth well in response to determining that the fourth well fails to fit inside the first bin;
assigning the first well to the first bin in response to determining that the first well fits inside the first bin;
generating a third bin for the second well in response determining that the second well fails to fit inside the first bin and the second bin; and
assigning the fifth well to the second bin in response to determining that the fifth well fails to fit inside the first bin and fits inside the second bin with the second well.

* * * * *